United States Patent [19]

Sakamoto

[11] Patent Number: 5,303,201
[45] Date of Patent: Apr. 12, 1994

[54] SEMICONDUCTOR MEMORY AND SEMICONDUCTOR MEMORY BOARD USING THE SAME

[75] Inventor: Hiroyuki Sakamoto, Tokyo, Japan
[73] Assignee: Kabushiki Kaisha Toshiba, Kawasaki, Japan
[21] Appl. No.: 39,906
[22] Filed: Mar. 30, 1993

[30] Foreign Application Priority Data

Mar. 30, 1992 [JP]    Japan .................................. 4-71954

[51] Int. Cl.⁵ .............................................. G11C 8/00
[52] U.S. Cl. ............................. 365/236; 365/230.01; 365/189.01
[58] Field of Search ............. 365/236, 230.01, 230.09, 365/189.01, 189.07, 239, 49

[56] References Cited

U.S. PATENT DOCUMENTS

| | | | |
|---|---|---|---|
| 5,014,210 | 5/1991 | Suzuki | 365/189.07 |
| 5,095,463 | 3/1992 | Toda et al. | 365/189.07 |

FOREIGN PATENT DOCUMENTS

| | | | |
|---|---|---|---|
| 60-209991 | 10/1985 | Japan | 365/230.01 |
| 61-222086 | 10/1986 | Japan | 365/230.01 |
| 61-77695 | 8/1987 | Japan | . |
| 2-177190 | 7/1990 | Japan | 365/230.01 |
| 2-206088 | 8/1990 | Japan | 365/230.01 |
| 3-113797 | 5/1991 | Japan | 365/230.01 |

Primary Examiner—Eugene R. LaRoche
Assistant Examiner—Tan Nguyen
Attorney, Agent, or Firm—Cushman, Darby & Cushman

[57] ABSTRACT

An address value is set in an address counter by a command supplied from an external circuit via data input/output pins. For this reason, no special-purpose address input pins need be arranged, and the number of pins need not be increased even when the capacity of a semiconductor memory chip is increased. Since the address value is automatically incremented by the address counter, when continuous addresses are to be accessed, the addresses need not be re-set, and a serial access can be efficiently realized. Since a chip address is assigned to each semiconductor memory chip according to a potential setting state of a chip select signal, no external control circuit for selecting a semiconductor memory chip is required, and a control operation can be simplified.

19 Claims, 11 Drawing Sheets

| | | | |
|---|---|---|---|
| A18 | 1 | 32 | VCC |
| A16 | 2 | 31 | $\overline{WE}$ |
| A15 | 3 | 30 | A17 |
| A12 | 4 | 29 | A14 |
| A7 | 5 | 28 | A13 |
| A6 | 6 | 27 | A8 |
| A5 | 7 | 26 | A9 |
| A4 | 8 | 25 | A11 |
| A3 | 9 | 24 | $\overline{OE}$ |
| A2 | 10 | 23 | A10 |
| A1 | 11 | 22 | $\overline{CE}$ |
| A0 | 12 | 21 | I/O7 |
| I/O0 | 13 | 20 | I/O6 |
| I/O1 | 14 | 19 | I/O5 |
| I/O2 | 15 | 18 | I/O4 |
| GND | 16 | 17 | I/O3 |

STATUS READ COMMAND

| BIT7 | BIT6 | BIT5 | BIT4 | BIT3 | BIT2 | BIT1 | BIT0 |
|------|------|------|------|------|------|------|------|
| WP | RDY/BSY | RFU | RFU | RFU | RFU | RFU | ERR |

RFU: RESERVED FOR FUTURE USE

| COMMAND | STEP | | | | | | |
|---|---|---|---|---|---|---|---|
| | 1 | 2 | 3 | 4 | 5 | --- | n |
| READ | 00H | | | | | | |
| WRITE | 10H | NUMBER OF DATA ITEMS 0-7 | NUMBER OF DATA ITEMS 8-15 | WRITE DATA 1 | WRITE DATA 2 | --- | WRITE DATA m |
| PROGRAM | 20H | NUMBER OF DATA ITEMS 0-7 | NUMBER OF DATA ITEMS 8-15 | PROGRAM DATA 1 | PROGRAM DATA 2 | | PROGRAM DATA m |
| CHIP ERASE | 30H | 30H | | | | | |
| BLOCK ERASE | 40H | 40H | | | | | |
| MEMORY ADDRESS SETTING | E0H | MEMORY ADDRESS 0-7 | MEMORY ADDRESS 8-15 | MEMORY ADDRESS 16-23 | MEMORY ADDRESS 24-31 | | |
| DATA COMPARISON | C0H | NUMBER OF DATA ITEMS 0-7 | NUMBER OF DATA ITEMS 8-15 | COMPARISON DATA 1 | COMPARISON DATA 2 | --- | COMPARISON DATA m |
| STATUS READ | B0H | STATUS | | | | | |
| RESET | FFH | | | | | | |

F I G. 5

FIG. 9A  $\overline{CE}$

FIG. 9B  $\overline{WE}$

FIG. 9C  $\overline{OE}$

SEMICONDUCTOR MEMORY AND SEMICONDUCTOR MEMORY BOARD USING THE SAME

BACKGROUND OF THE INVENTION

1. Field of the Invention

The present invention relates to a semiconductor memory and, more particularly, to a semiconductor memory, which can be used as a file device serving as an alternative for a floppy disk, a hard disk, or the like in information equipment such as a computer.

2. Description of the Related Art

Figure 1:
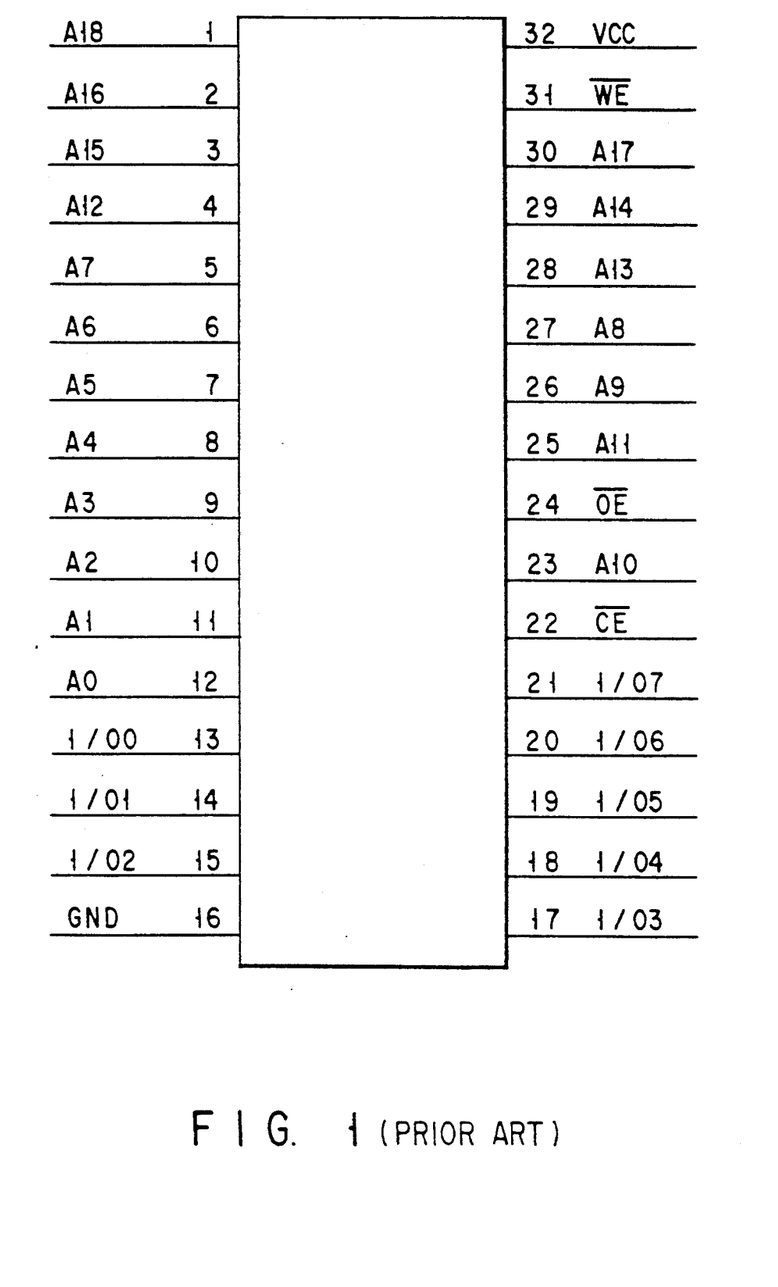
FIG. 1 is a plan view showing a pin arrangement of a conventional semiconductor memory.

Conventionally, a semiconductor memory is manufactured under an assumption that it is used as a main memory for, e.g., a computer, and can be directly accessed from a CPU. More specifically, an address signal generated by a CPU is connected to an address signal of a semiconductor memory, thereby directly addressing the memory. FIG. 1 shows a typical arrangement of I/O pins of such a conventional semiconductor memory.

A semiconductor memory shown in FIG. 1 has a memory capacity of 4 Mbits (512K×8 bits), and is constituted by a package having 32 pins, as shown in FIG. 1. Of the 32 pins, 19 pins are address input terminals for receiving address signals A0 through A18. In this manner, the conventional semiconductor memory requires special-purpose address input terminals corresponding in number to its memory capacity.

For this reason, when the memory capacity of a semiconductor memory is increased to 8, 16, or 64 Mbits in future, the number of address input terminals is increased accordingly. Therefore, the size of the package for storing the semiconductor memory is increased. As a result, a mounting space on a printed circuit board on which the package is mounted is also increased.

Therefore, the arrangement of the conventional semiconductor memory premised on direct addressing from the CPU is suitable for a case wherein the CPU executes a program, and a case wherein the CPU directly accesses data in the memory. However, when the semiconductor memory is used as a file device requiring a large memory capacity such as a floppy disk, a hard disk, or the like, it poses a problem about its mounting space.

The direct addressing method from the CPU is advantageous for a high-speed access. However, since the direct addressing method occupies a memory address space of the CPU, it undesirably oppresses the address space of the main memory. For this reason, when the semiconductor memory is used as a file such as a floppy disk, a hard disk, or the like, the addressing method is preferably realized by an I/O access method. In the I/O access method, an address counter for storing addresses of the semiconductor memory is allocated in an I/O space of the CPU, and an address to be accessed of the semiconductor memory is written in the counter so as to perform a read or write operation.

However, when the semiconductor memory shown in FIG. 1 is to be accessed by the I/O access method, a control circuit such as an address circuit must be realized outside the semiconductor memory. When a file device is constituted by, e.g., a memory board mounting a plurality of semiconductor memories, a control circuit must be prepared in consideration of the memory capacities of the memories, and the number of mounted memories, and the like. As a result, the arrangement of the control circuit becomes complicated.

SUMMARY OF THE INVENTION

It is an object of the present invention to provide a semiconductor memory, which can decrease the number of pins, can simplify an external control circuit, and is suitably used as a large-capacity filing device such as a floppy disk, a hard disk, or the like, and a memory board and a memory card using the semiconductor memory.

In order to achieve the above object, a semiconductor memory according to the present invention comprises, on one chip, a memory cell array, a plurality of data input/output terminals for exchanging input/output data to the memory cell array with an external circuit, an address counter for sequentially incrementing a value of address data set therein, and outputting the incremented address data, means for receiving a command supplied from the external circuit via the data input/output terminals, and setting a value of address data designated by the command in the address counter, an access circuit for selectively accessing the memory cell array in accordance with a value of a lower-bit portion, corresponding to a storage capacity of the memory cell array, of the address data output from the address counter, a plurality of chip selection input terminals set with potentials for assigning a chip address, and an access control circuit for comparing a chip address value defined by a potential setting state of the plurality of chip selection input terminals and a value of an upper-bit portion of the address data output from the address counter, and enabling/disabling access operation by the access circuit according to a coincidence/non-coincidence between the two address values.

In this semiconductor memory, since an address value indicating an access location of the memory cell array is designated by a command supplied via the data input/output terminals, no special-purpose address input terminals are needed, and the number of terminals need not be increased even when the capacity of the semiconductor memory is increased. Since the address value is automatically incremented by the address counter, when successive addresses are to be accessed, the addresses need not be re-set, and a serial access can be efficiently realized. Furthermore, a chip address is assigned to the semiconductor memory according to the potential setting state of the chip selection input terminals, and an access is enabled only when the chip address value and the upper-bit portion of the output value from the address counter coincide with each other. For this reason, no external control circuit for selecting a chip is needed, and a control operation can be simplified. Therefore, the number of pins can be decreased, and an external control circuit can be simplified, thus providing a semiconductor memory and a memory board suitably used as a large capacity file device such as a floppy disk, a hard disk, or the like.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

The preferred embodiment of the present invention will be described hereinafter with reference to the accompanying drawings.

Figure 2:
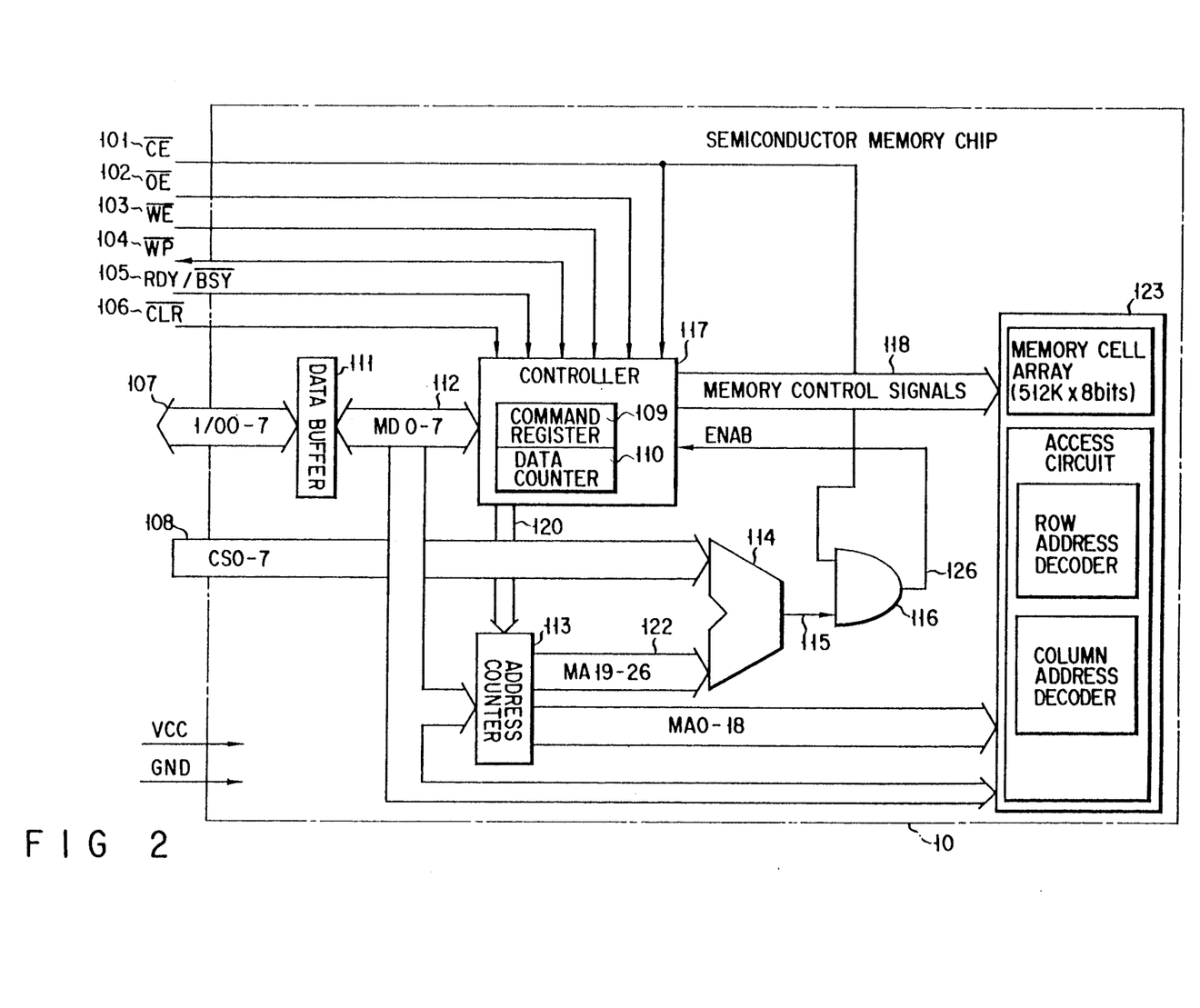
FIG. 2 is a block diagram showing a circuit arrangement of a semiconductor memory according to an embodiment of the present invention.

FIG. 2 shows a circuit arrangement of a semiconductor memory according to an embodiment of the present invention. A semiconductor memory chip 10 is realized as a static RAM (SRAM) or a mask ROM, which allows read/write accesses in units of bytes, an EEPROM, which is electrically erasable/programmable in units of bytes, or a flash EEPROM, which is electrically erasable/ programmable in units of chips or blocks, and has the following arrangement so as to decrease the number of pins and to simplify an external control circuit.

In FIG. 2, reference numeral 101 denotes a chip enable signal ($\overline{CE}$). When the chip enable signal is active (low), an access to the memory chip 10 is enabled. Reference numeral 102 denotes an output enable signal ($\overline{OE}$). When the output enable signal is active (low), data can be output from the memory chip 10, and is used as a read signal. Reference numeral 103 denotes a write enable signal ($\overline{WE}$). When the write enable signal is active (low), data is transferred to the memory chip 10, and is used as a write signal. Reference numeral 104 denotes a write protection signal ($\overline{WP}$). When the write protection signal is active (low), a write access to the memory chip 10 is disabled. Reference numeral 105 denotes a ready/busy signal (RDY/$\overline{BSY}$) output from the memory chip 10. When the ready/busy signal is at high level, it indicates that the memory chip 10 is ready; otherwise, it indicates that the memory chip 10 is busy, and other operations such as a data transfer operation are disabled during this interval. Reference numeral 106 denotes a clear signal ($\overline{CLR}$). When the clear signal goes active (low), the memory chip 10 is initialized.

Reference numeral 107 denotes an I/O data bus for transferring commands, data, status, and the like. The I/O data bus (I/O 0-7) 107 has an 8-bit width, and is connected to eight data I/O terminals of the semiconductor chip 10. Reference numeral 108 denotes a chip select signal (CS0-7) for chip address assignment. In this case, the signal 108 is an 8-bit signals, and can assume values from 0 through 255. When a plurality of memory chips are mounted on a circuit board, the value of the chip select signal indicates the serial number of a specific memory chip. As the chip select signal (CS0-7) 108, a potential of a power supply terminal or a ground terminal on the circuit board, which mounts the semiconductor memory chip 10, is used.

Reference numeral 109 denotes a command register for storing a command supplied from an external circuit via the data bus 107. Reference numeral 110 denotes a data counter for storing a data length of data to be transferred. Reference numeral 111 denotes a data buffer, which serves as an I/O data buffer. Reference numeral 112 denotes an internal data bus (MD) of the memory chip 10, which has an 8-bit width as in the data bus 107. Reference numeral 113 denotes an address counter for generating an address, which can be supported by the memory chip 10, in a maximum of a 32-bit address space. In this embodiment, an address generated from the address counter 113 consists of 27 bits (i.e., 0th to 26th bits). Of the 27-bit address, the value of lower bits corresponding to the actual memory capacity of the memory chip 10 is used for accessing a memory cell array, and upper bits are compared with a chip address. In this embodiment, the memory capacity is assumed to be 512K×8 bits. Therefore, of the 27-bit address, lower 19 bits (MA0-18) are used for accessing the memory cell array, and upper 8 bits (MA19-26) are compared with a chip address designated by the chip select signal (CS0-7) 108.

Reference numeral 114 denotes a comparator for comparing upper bits (MA19-26) 122 of an address signal output from the address counter 113 with the chip select signal (CS0-7). Reference numeral 115 denotes an output signal from the comparator 114, which indicates that the value of the upper bits (MA19-26) 122 of an address signal output from the address counter 113 coincides with the value of the chip select signal (CS0-7) 108. Reference numeral 116 denotes an AND gate for receiving the coincidence signal from the comparator 114 and the chip enable signal ($\overline{CE}$) 101, and generating an internal enable signal (ENAB) 126 for enabling an access to the memory cell array.

Reference numeral 117 denotes a control circuit for interpreting external commands, and executing various control operations such as generation of various control signals for controlling accesses to the memory cells. Reference numeral 118 denotes memory control signals, which include read/write signals to the memory. Reference numeral 120 denotes an address counter control signal for performing control operations such as an address setting operation to the address counter 113, an updating operation of the address counter 113, and the like. Reference numeral 121 denotes an internal memory address signal of the chip described above, which signal indicates a lower address. In this embodiment, in order to access the 4 Mbit (512K × 8 bits) memory cell array, the memory address signal 121 consists of 19 bits (0th through 18th bits). Reference numeral 122 denotes an internal memory address signal of the chip, which signal indicates an upper address, and is compared with the chip select signal (CS0-7) 108 so as to select a chip.

Reference numeral 123 denotes a memory circuit, which includes a memory cell array including memory cells arranged in a matrix in the row and column directions, and an access circuit for accessing the memory cell array. The memory circuit selectively accesses the memory cell array according to the value of the memory address signal 121, and comprises a row address decoder, a column address decoder, and the like.

The memory cell array is a group of memory cells for storing information. In this embodiment, the type of memory cell is not particularly limited. More specifically, the memory cell may be various types of memory cells such as static RAMs (SRAMs) or mask ROMs, which allow read/write accesses in units of bytes, EEPROMs, which are electrically erasable/programmable in units of bytes, flash EEPROMs, which are electrically erasable/programmable in units of chips or blocks, and the like.

Figure 3:
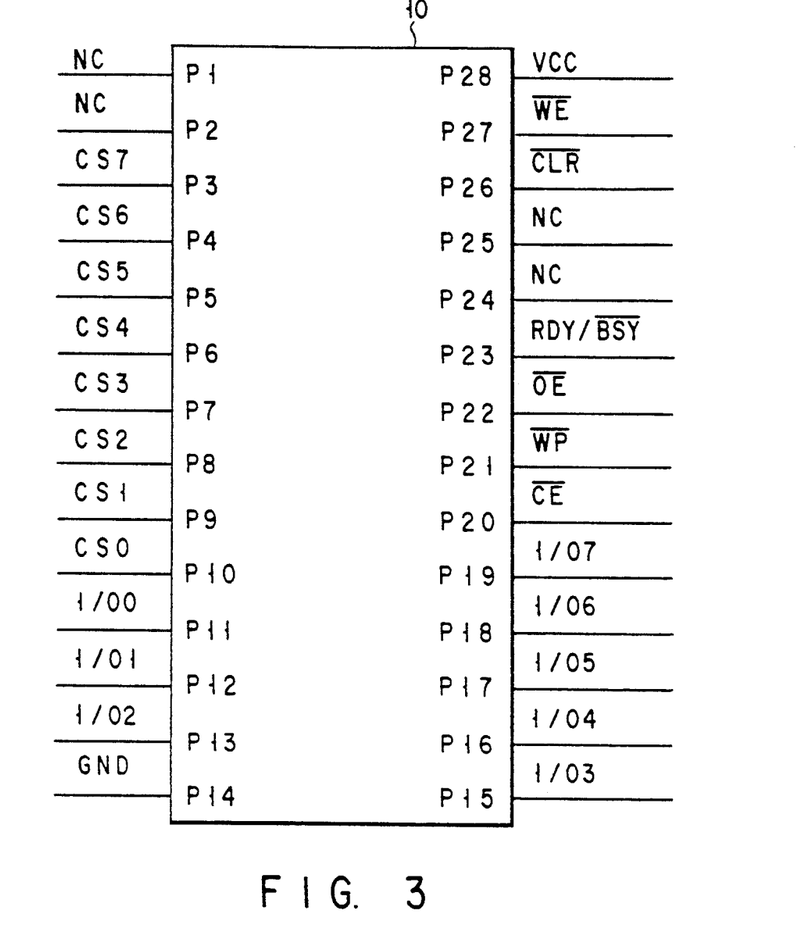
FIG. 3 is a plan view showing a pin arrangement of the semiconductor memory of the embodiment shown in FIG. 2.

FIG. 3 shows an arrangement of I/O pins (terminals) of the semiconductor memory chip 10. As shown in FIG. 3, 28 pins P1 through P28 are arranged, but no special-purpose address input pins are arranged. This is because an address is input by utilizing eight data I/O pins P11 through P13 and P15 through P19 connected to the data bus (I/O0-7) 107.

In FIG. 3, the pins P1, P2, P24, and P25 are unused pins; the pins P3 through P10 are input pins for the chip select signal (CS0-7) 108; the pin P14 is a ground (GND) pin; the pin P20 is an input pin for the chip enable signal ($\overline{CE}$) 101; the pin P21 is an input pin for the write protection signal ($\overline{WP}$) 104; the pin P22 is an input pin for the output enable signal ($\overline{OE}$) 102; the pin P23 is an output pin for the ready/busy signal (RDY/$\overline{BSY}$) 105; the pin P26 is an input pin for the clear signal ($\overline{CLR}$) 106; and the pin P27 is an input pin for the write enable signal ($\overline{WE}$) 103.

In the semiconductor memory chip 10 with the above-mentioned circuit arrangement and the pin arrangement, a command supplied from an external circuit via the data I/O pins P11 through P13 and P15 through P19 is interpreted by the control circuit 117. When the input command is an address setting command, an address value designated by the input command is set in the address counter 113. For this reason, no special-purpose address input pins need be arranged, and the number of pins need not be increased even when the capacity of the semiconductor memory chip 10 is increased. Since the address value is automatically incremented by the address counter 113, when successive addresses are to be accessed, the addresses need not be re-set, and a serial access can be efficiently realized. Furthermore, a chip address is assigned to the semiconductor memory chip 10 according to the potential setting state of the chip select signal 108, and an access is enabled only when the chip address value and the upper bits of the output value from the address counter 113 coincide with each other. For this reason, no external control circuit for selecting the semiconductor memory chip 10 need be arranged, and a control operation can be simplified.

Figure 4:
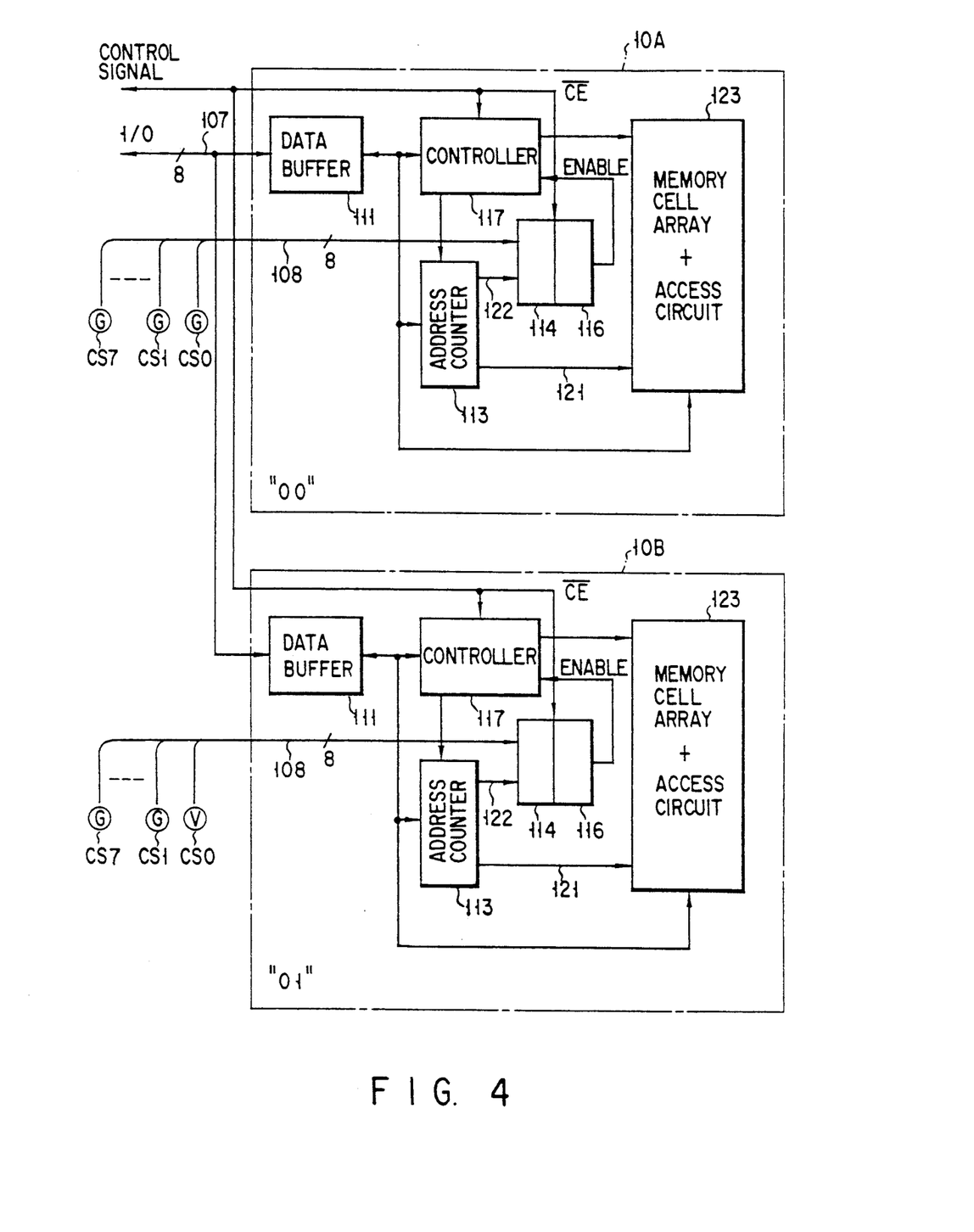
FIG. 4 is a diagram for explaining a principle of assigning a chip address to the semiconductor memory of the embodiment shown in FIG. 2.

The principle of assigning a chip address to the semiconductor memory chip 10 will be described below with reference to FIG. 4.

A case wherein two semiconductor memory chips 10 having the arrangement shown in FIG. 2 are mounted on a circuit board, and continuous chip addresses are assigned to these first and second semiconductor memory chips 10A and 10B will be discussed. In this case, 8 bits of a chip select signal (CS0-7) 108 of the semiconductor memory chip 10A are set to be "00000000", and 8 bits of a chip select signal (CS0-7) 108 of the semiconductor memory chip 10B are set to be "00000001". The chip select signal (CS0-7) 108 is set by connecting the pins P3 through P10 to a power supply terminal VCC (V) or ground terminal GND (G) on the circuit board, as has been described above with reference to FIG. 3. Logic "1" is obtained by connecting a corresponding pin to the power supply terminal VCC (V) on the circuit board, and logic "0" is obtained by connecting a corresponding pin to the ground terminal GND (G) on the circuit board.

When the chip select signals (CS0-7) 108 of "00000000" and "00000001" are respectively supplied to the semiconductor memory chips 10A and 10B upon the above-mentioned potential setting of the pins P3 through P10, the semiconductor memory chip 10A allows a memory access only when upper 8 bits (MA19-26) 122 of a 27-bit address signal output from the address counter 113 are "00000000"; the semiconductor memory chip 10B allows a memory access only when upper 8 bits (MA19-26) 122 of a 27-bit address signal output from the address counter 113 are "00000001".

More specifically, of a total of 1,024 KB (512KB + 512 KB) address space of the two semiconductor memory chips 10A and 10B, the first-half 512 KB address space is assigned to the semiconductor memory chip 10A, and the second-half 512 KB address space is assigned to the semiconductor memory chip 10B.

An access operation of the semiconductor memory chip 10 shown in FIG. 2 will be described below with reference to FIGS. 5 through 10D.

Figure 5:
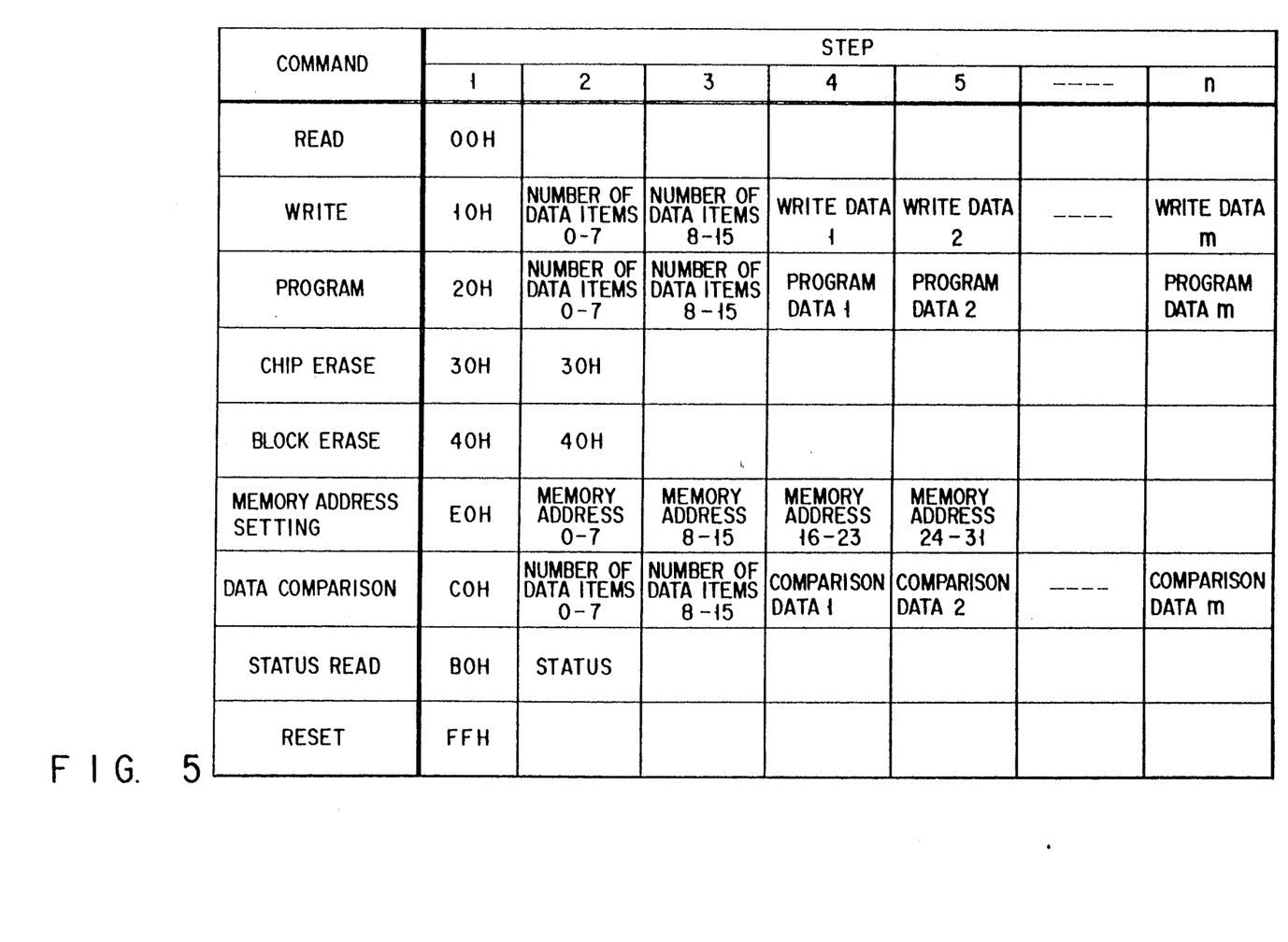
FIG. 5 is a table showing a list of commands for controlling operation modes of the semiconductor memory of the embodiment shown in FIG. 2.

Commands supplied to the semiconductor memory chip 10 will be explained below with reference to FIG. 5. Commands supplied to the semiconductor memory chip 10 include a read command, a write command, a program command, a chip erase command, a block erase command, a memory address setting command, a data comparison command, a status read command, and a reset command, as shown in FIG. 5.

The read command is used for controlling the operation of the semiconductor memory chip 10 in a read mode, and its command code is "00H" (H represents hexadecimal notation). The write command is used for controlling the operation of the semiconductor memory chip 10 in a write mode, and its command code is "10H" (H represents hexadecimal notation). In the case of the write command, 2-byte input data following the command code "10H" designates the number of bytes of data to be written. Thereafter, actual data to be written is input in units of bytes. The write mode is used when the memory cell comprises a static RAM (SRAM).

The program command is used for controlling the operation of the semiconductor memory chip 10 in a program mode, and its command code is "20H". In the case of the program command, 2-byte input data following the command code "20H" designates the number of bytes of program data. Thereafter, actual data to be programmed is input in units of bytes. The program mode is used when the memory cell comprises a flash EEPROM, an EEPROM, an EPROM (ultraviolet erasable PROM), and the like, i.e., when a special program operation is required for a data write access.

The chip erase command is used for controlling the operation of the semiconductor memory chip 10 in a chip erase mode, and its command code is "30H". The chip erase command is used for electrically simultaneously erasing the content of the entire chip (e.g., a flash EEPROM), and the command code "30H" is transferred twice so as to prevent the chip from being erroneously erased.

The block erase command is used for controlling the operation of the semiconductor memory chip 10 in a block erase mode, and its command code is "40H". The block erase command is used for erasing data in units of 512-byte or 4-Kbyte blocks for, e.g., a flash EEPROM, and the command code "40H" is transferred twice so as to prevent the chip from being erroneously erased.

The memory address setting command is used for setting an address in the semiconductor memory chip 10 so as to designate an access location of the memory cell array, and its command code is "E0H". In the memory address setting mode, 4-byte (32-bit) address data is transferred after the command code "E0H". The transferred address data is set in the address counter 113. The memory address setting command is input prior to the command code in order to designate an access location in each of the above-mentioned read, write, program, and block erase modes.

The data comparison command is used for checking (program-verifying) correctness of the write operation of the semiconductor memory chip 10, and its command code is "C0H". In the data comparison mode, 2-byte input data following the command code "C0H" designates the number of bytes of data to be compared, and subsequently, actual data to be compared with data already written in the memory cell array is transferred. Whether or not a comparison result indicates a coincidence can be detected by the status read command.

Figure 6:
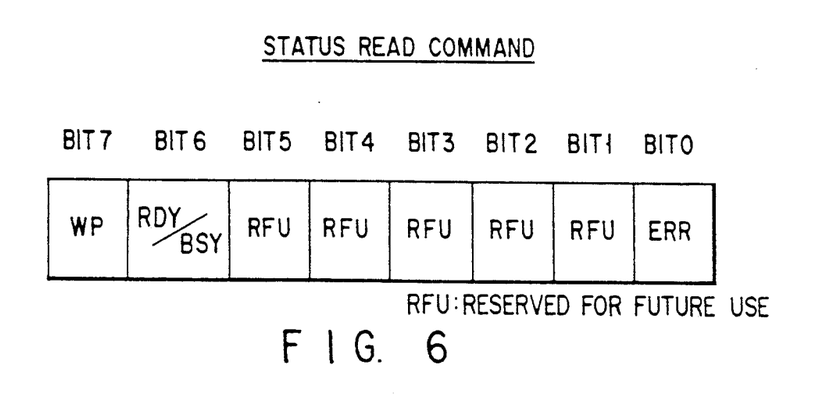
FIG. 6 shows a format of status information read out from the semiconductor memory of the embodiment shown in FIG. 2.
Figure 7A:
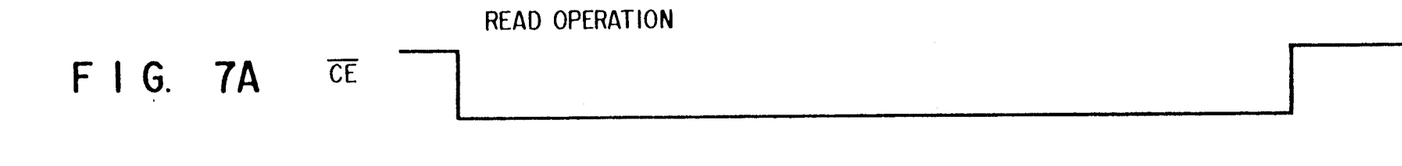
FIGS. 7A through 7D are timing charts for explaining a read operation of the semiconductor memory of the embodiment shown in FIG. 2.
Figure 7B:
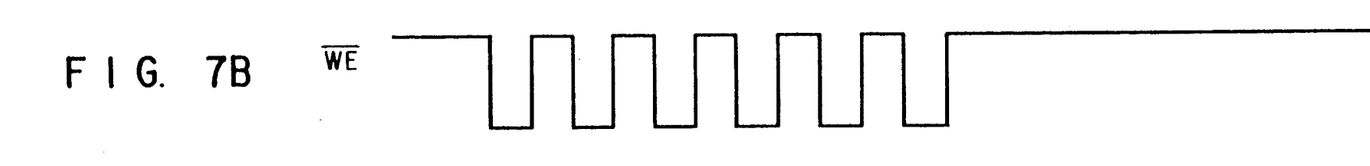
Figure 7C:
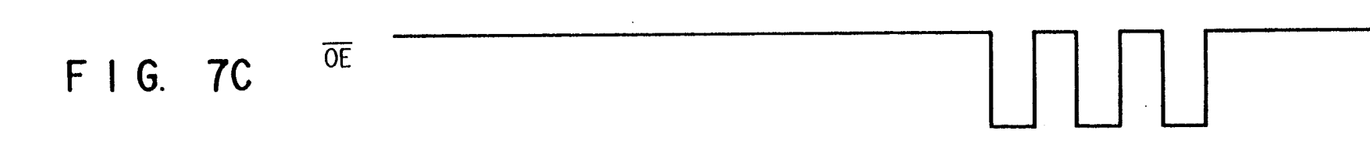
Figure 7D:
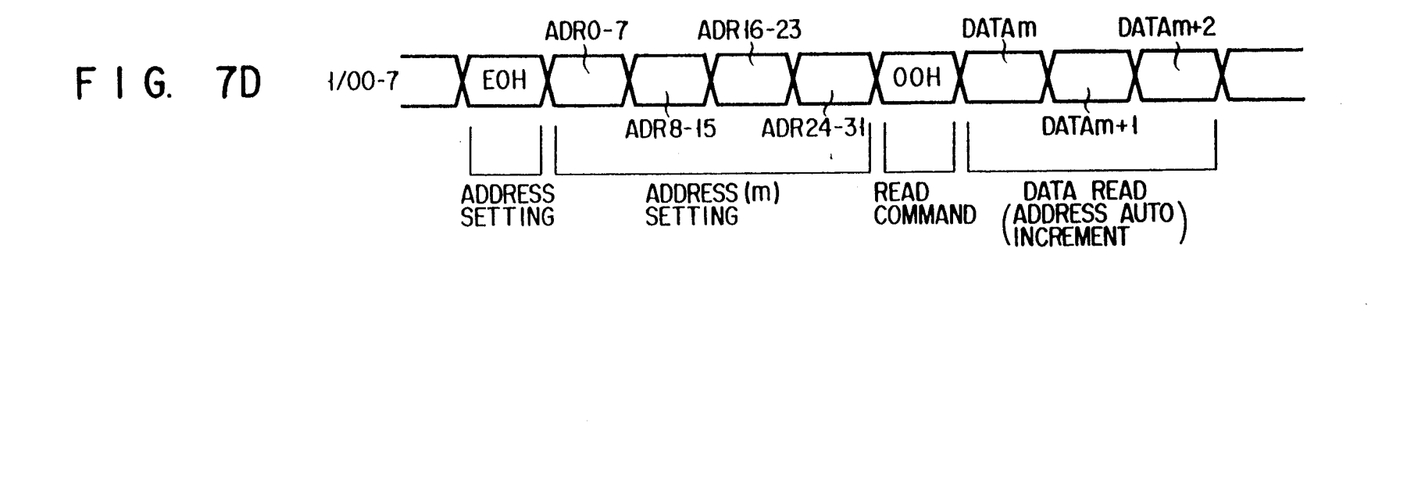
Figure 8A:
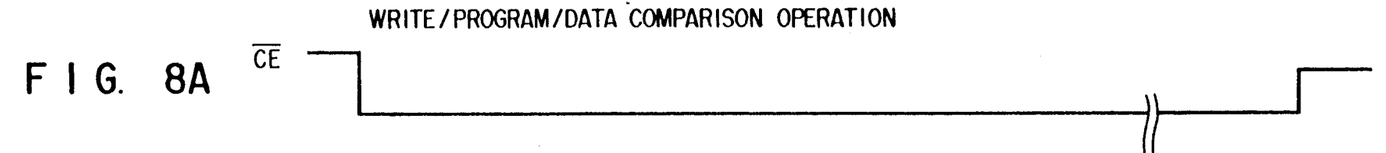
FIGS. 8A through 8D are timing charts for explaining a write/program/data comparison operation of the semiconductor memory of the embodiment shown in FIG. 2.
Figure 8B:
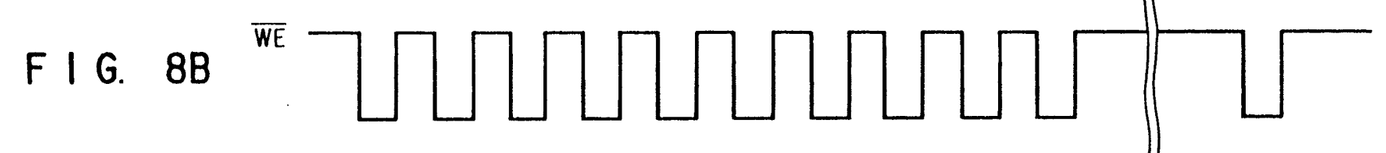
Figure 8C:
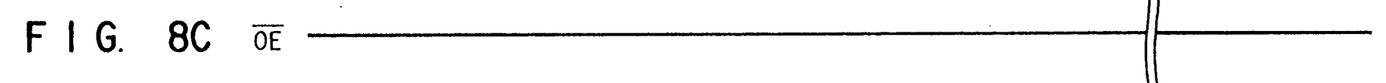
Figure 8D:
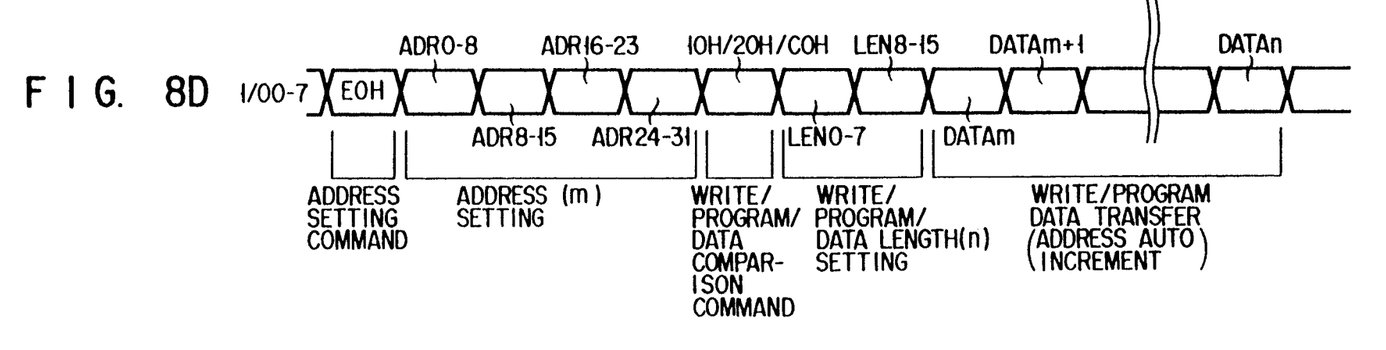
Figure 9A:
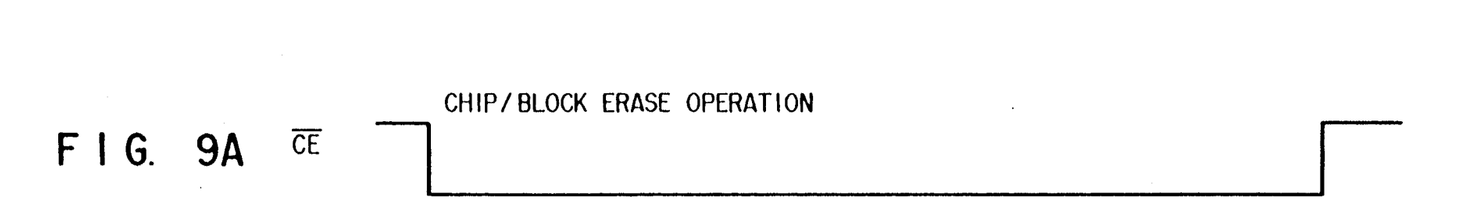
FIGS. 9A through 9D are timing charts for explaining a chip/block erase operation of the semiconductor memory of the embodiment shown in FIG. 2.
Figure 9B:
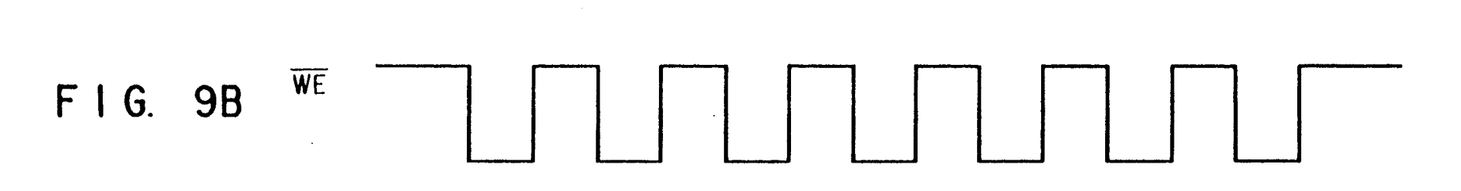
Figure 9C:
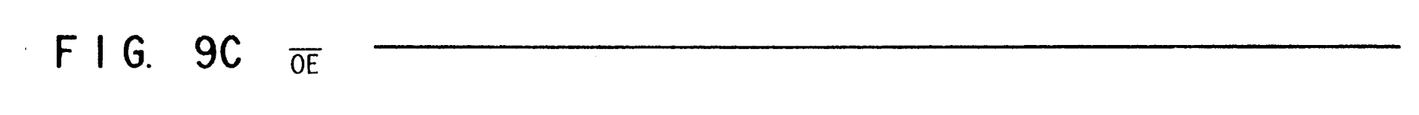
Figure 9D:
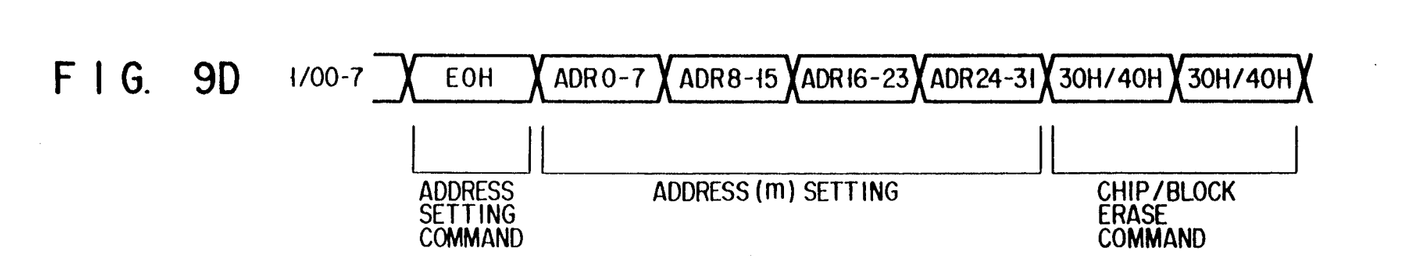
Figure 10A:
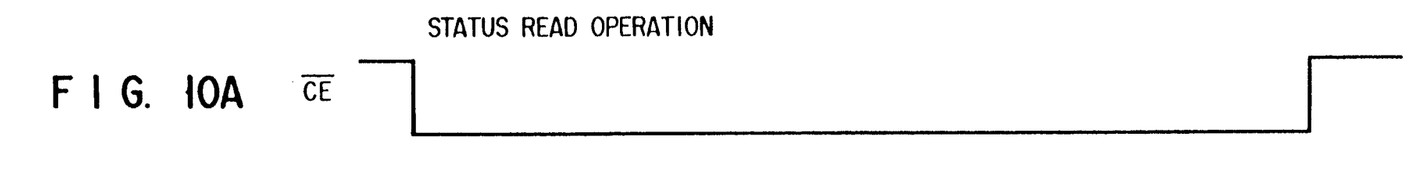
FIGS. 10A through 10D are timing charts for explaining a status read operation of the semiconductor memory of the embodiment shown in FIG. 2.
Figure 10B:
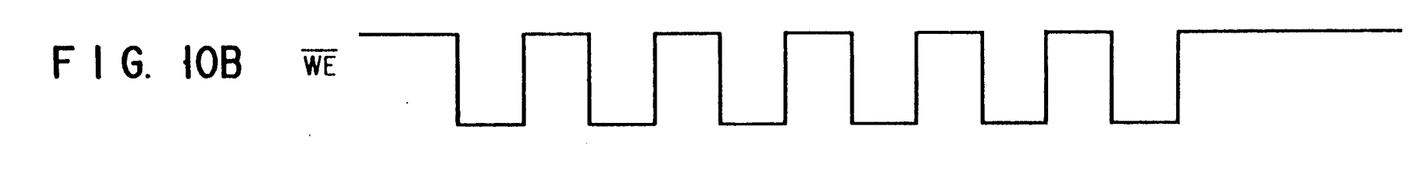
Figure 10C:
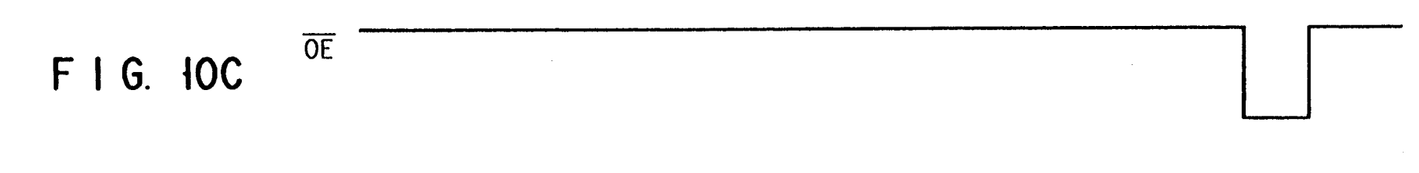
Figure 10D:
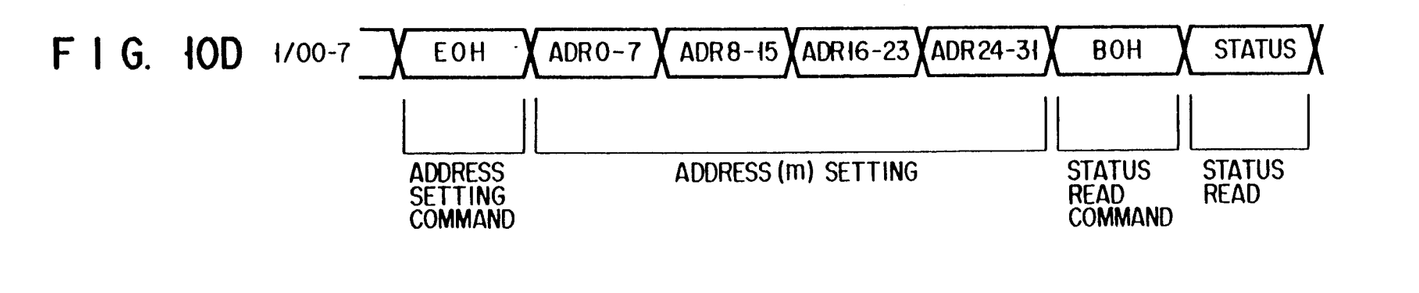

The status read command is used for reading various status data of the semiconductor memory chip 10 (e.g., the presence/absence of a coincidence of a comparison result), and its command code is "B0H". In the status read mode, status information having the format shown in FIG. 6 is read out after the command code "B0H". As shown in FIG. 6, the status information consists of 1 byte. In this information, bit 7 indicates status of a write inhibit signal; bit 6 indicates status of a ready/busy signal; and bit 0 is an error signal indicating a non-coincidence of the content of the data comparison command. Other bits (RFU) are reservation bits for future use, and are not used currently.

The reset command is a command for resetting the semiconductor memory chip 10, and its command code is "FFH". When the command code "FFH" is input, the operation environment so far of the semiconductor memory chip 10 is initialized.

FIGS. 7A through 7D show operation timings of the semiconductor memory chip 10 in the read mode.

More specifically, in the read command, the address setting command (E0H) is input to the control circuit 117 prior to the input of the read command so as to designate an address value of data to be read. This address value is set in the address counter 113 under the control of the control circuit 117. Subsequently, the read command (00H) is input to the control circuit 117, and the read mode is set. When the address setting command (E0H), data indicating the address value, and the read command (00H) are input, the chip enable signal ($\overline{CE}$) 101 is set at low level, and the write enable signal ($\overline{WE}$) 103 sequentially goes to low level.

In the read mode, the output enable signal ($\overline{OE}$) 102 goes to low level by a number of times corresponding to the number of bytes of data to be read while the chip enable signal ($\overline{CE}$) 101 is set at low level. When the output enable signal ($\overline{OE}$) 102 goes to low level, data designated by a value (m in this case) of a lower-bit portion (MA0–18) 121 of an address signal output from the address counter 113 can be read. After the data is read, the value of the address counter 113 is incremented (+1) by the control circuit 117. Thus, in accesses to the following successive addresses, addresses need not be re-set in the address counter 113. When a write access is made in the read mode, the first byte is regarded as a command code.

FIGS. 8A through 8D show operation timings of the semiconductor memory chip 10 in the write/program/data comparison mode.

In the write/program/data comparison mode, the address setting command (E0H) is input to the control circuit 117 prior to the input of the write/program/data comparison command so as to designate an address value of data to be written (an address value of data to be compared in the data comparison mode) like in the above-mentioned read mode. The input address value is set in the address counter 113 under the control of the control circuit 117. Subsequently, the write command (10H), the program command (20H), or the data comparison command (C0H) is input to the control circuit 117, and the write mode, the program mode, or the data comparison mode is set. When the write or program mode is set, the number (n) of bytes of data to be written is designated by 2-byte data input after the command code. Thereafter, actual data to be written/programmed is transferred by the designated number (n) of bytes, and is simultaneously written in the memory cell designated by the address counter 113. After the data is written, the value of the address counter 113 is incremented (+1) by the control circuit 117. Thus, in accesses to the following successive addresses, addresses need not be re-set in the address counter 113.

In the data comparison mode, the number (n) of bytes of data to be compared is designated after the command code. Thereafter, actual data to be compared is transferred by the designated number (n) of bytes, and is simultaneously compared with comparison data read out from the memory cell designated by the address counter 113. The address counter is incremented (+1) every time data is transferred.

FIGS. 9A through 9D show operation timings of the semiconductor memory chip 10 in the chip/block erase mode.

In the chip/block erase mode, the address setting command (E0H) is input to the control circuit 117 prior to the input of the erase command so as to designate an address value. The address value (m) indicates an address of a chip to be erased in the chip erase mode, and indicates an address of a block to be erased in the block erase mode. The address value (m) is set in the address counter 113 under the control of the control circuit 117. Thereafter, when the command code (30H/40H) is transferred twice, the chip or block erase operation is executed.

FIGS. 10A through 10D show operation timings of the semiconductor memory chip 10 in the status read mode.

In the status read mode as well, the address setting command (E0H) is input to the control circuit 117 prior to the input of the erase command so as to designate an address value. The address value (m) indicates a chip to be subjected to a status read operation. The address value (m) is set in the address counter 113 under the control of the control circuit 117. Then, the status read command (B0H) is input to set the status read mode. In this state, status information is read out when the output enable signal ($\overline{OE}$) 102 goes to low level.

In this manner, since the operation mode of the semiconductor memory chip 10 is controlled by the command code, the CPU can control the operation of the semiconductor memory chip 10 by the I/O access method. For this reason, the CPU need only have a small I/O address space for transferring commands to the semiconductor memory chip 10, so that the memory address space of the CPU can be prevented from being overly occupied for this purpose.

An arrangement of a semiconductor memory board using the semiconductor memory chip 10 having the arrangement shown in FIG. 2 will be described below with reference to FIGS. 11 and 12.

Figure 11:
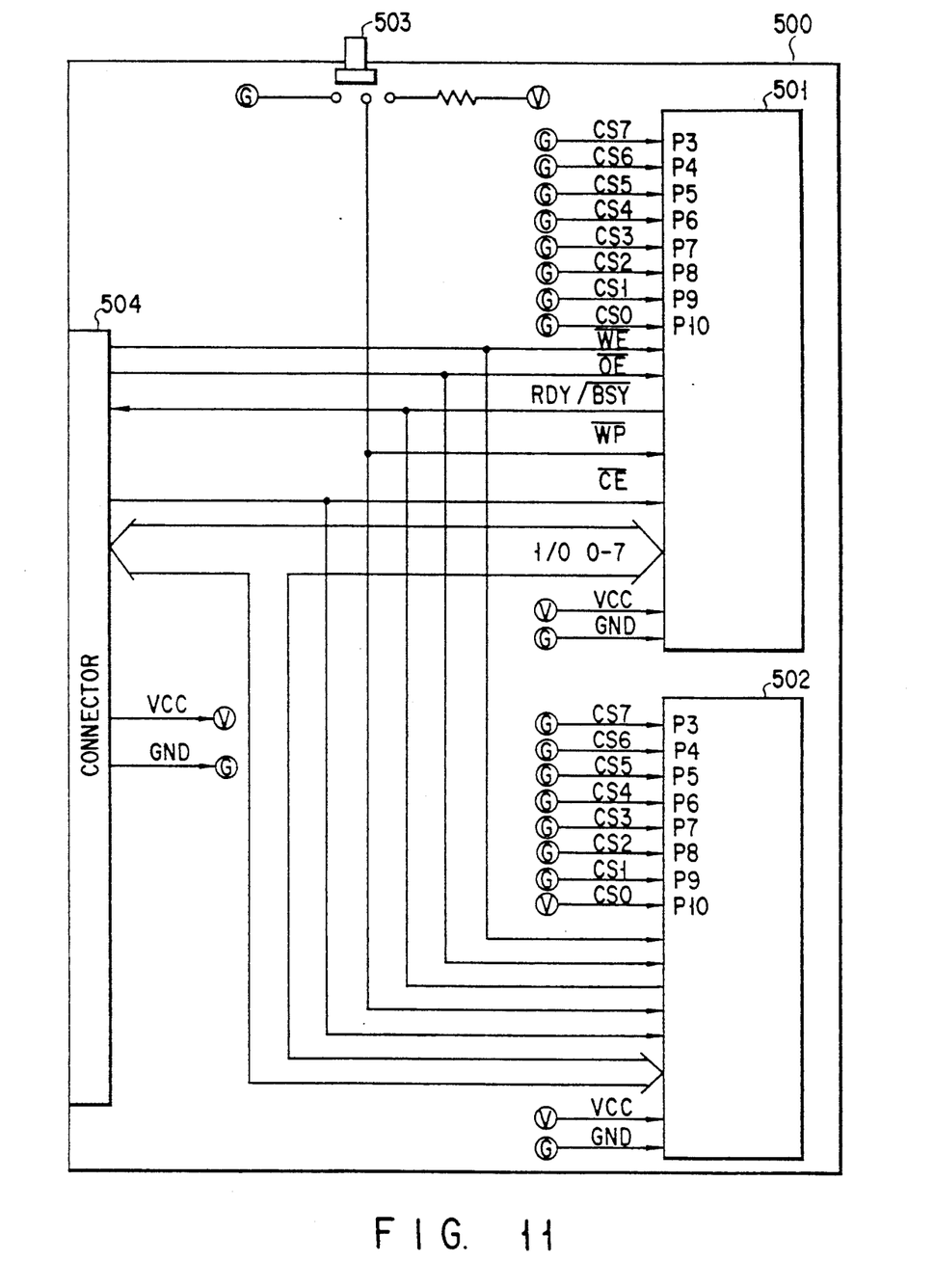
FIG. 11 is a diagram showing an arrangement of a memory board constituted by using the semiconductor memory of the embodiment shown in FIG. 2.

FIG. 11 shows a memory board, which mounts two semiconductor memory chips 10, and has an 8-bit data width.

In FIG. 11, reference numeral 500 denotes a circuit board. The circuit board 500 serves as a circuit board for a memory board used as an alternative for a floppy disk or a hard disk when it mounts memory chips 501 and 502. Reference numeral 501 denotes a first memory chip, which is arranged in a lower address space than the second memory chip 502. Reference numeral 502 denotes a second memory chip, which is arranged in an upper address space than the first memory chip 501. Reference numeral 503 denotes a write protection switch, which enables a write access at low level; and disables a write access at high level. The write protection switch 503 is turned on/off by a user. Reference numeral 504 denotes a connector, which serves as an interface for connecting the memory board to an information processing apparatus main body such as a computer.

In the first memory 501 arranged in the lower address space, 8 bits of a chip select signal (CS0-7) are set to be all "0"s when pins P3 through P10 are connected to a ground line GND (G) on the circuit board 500. On the other hand, of 8 bits of a chip select signal (CS0-7) in the memory 502 arranged in the upper address space, the least significant bit (CS0) is set to be "1" and the remaining 7 bits are set to be "0"s when a pin P10 is connected to a power supply line VCC (V) on the circuit board 500, and the remaining pins P3 through P9 are connected to the ground line GND (G)) on the circuit board 500.

When the potential setting operation of the pins P3 through P10 is performed in this manner, the following addresses are assigned to the memories 501 and 502. More specifically, as has been described above with reference to FIG. 4, if the memory capacity of each of the memories 501 and 502 is assumed to be 512 Kbytes, the memory 502 is arranged in an address space from 0th to 512nd Kbytes, and the memory 501 is arranged in an address space from the 512nd to 1,024th Kbytes.

Figure 12:
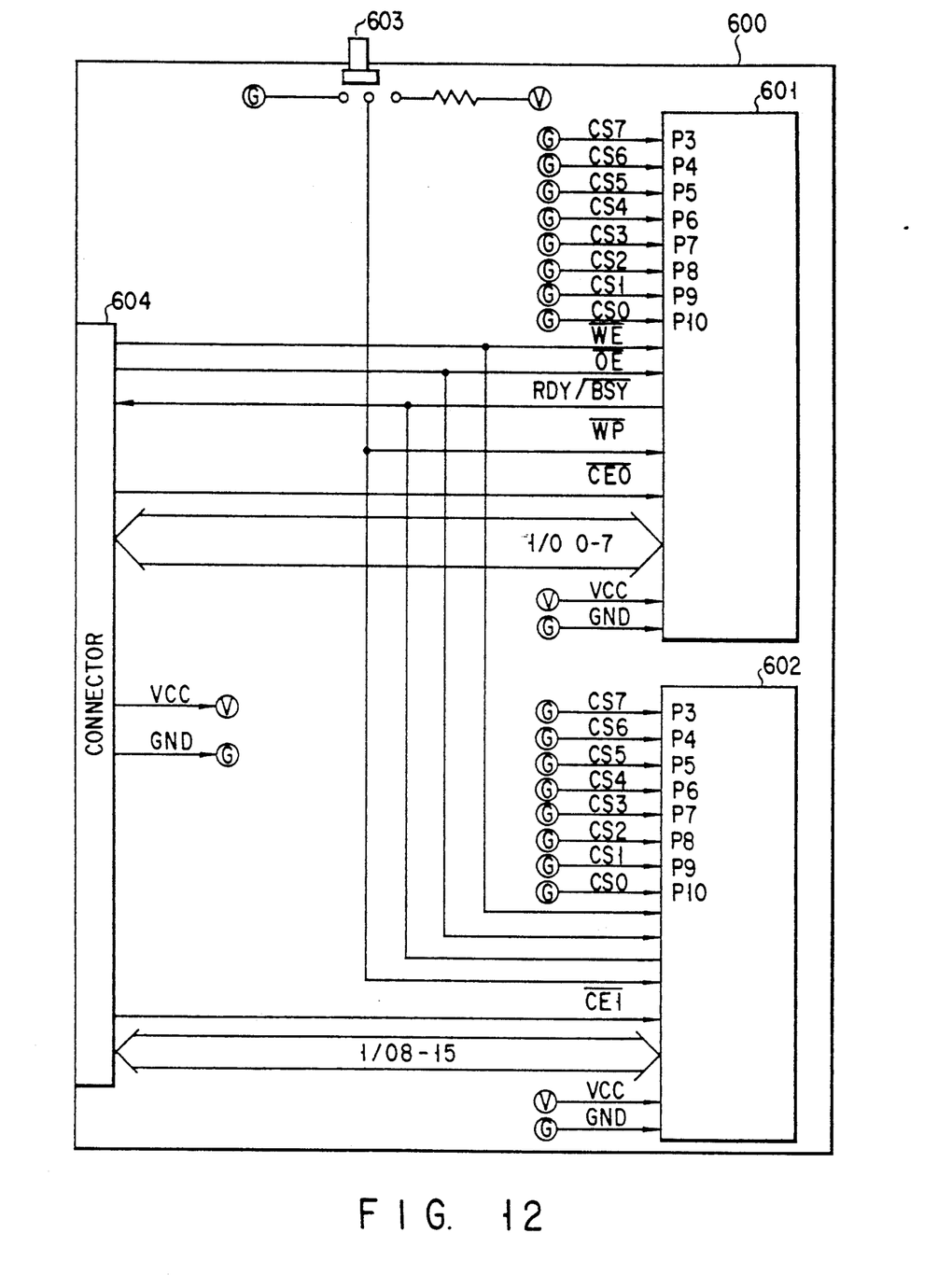
FIG. 12 is a diagram showing another arrangement of a memory board constituted by using the semiconductor memory of the embodiment shown in FIG. 2.

FIG. 12 shows a memory board, which mounts two semiconductor memory chips 10, and has a 16-bit data width.

In FIG. 12, reference numeral 600 denotes a circuit board. The circuit board 600 serves as a circuit board for a memory board used as an alternative for a floppy disk or a hard disk when it mounts memory chips 601 and 602. Reference numerals 601 and 602 denote first and second memory chips, respectively. The first memory 601 is arranged in the lower data byte (I/O0-7) of the 16-bit width, and the second memory 602 is arranged in the upper data byte (I/O8-15) of the 16-bit width. Reference numeral 603 denotes a write protection switch, which enables a write access at low level; and disables a write access at high level. The write protection switch 603 is turned on/off by a user. Reference numeral 604 denotes a connector, which serves as an interface for connecting the memory board to an information processing apparatus main body such as a computer, and has a 16-bit wide data I/O interface.

In the first memory 601, 8 bits of a chip select signal (CS0-7) are set to be all "0"s when pins P3 through P10 are connected to a ground line GND (G) on the circuit board 600. Similarly, in the second memory 602, 8 bits of a chip select signal (CS0-7) are set to be all "0"s when pins P3 through P10 are connected to the ground line GND (G) on the circuit board 600. The same word (2-byte) address is set in the address counters 113 of the memories 601 and 602. In addition, the same command is simultaneously set in the memories 601 and 602, and a read/write access of 2-byte (16-bit) data can be simultaneously performed. In this arrangement, if each of the memories 601 and 602 has an arrangement of $512K \times 8$ bits, a memory of $512K \times 16$ bits can be realized.

Note that the memory boards shown in FIGS. 11 and 12 can be realized as expansion boards loaded into a computer system, and can also be realized as memory cards if they are coated by a coating material such as a plastic material.

As described above, in the semiconductor memory chip 10 of this embodiment, the following advantages can be expected when the chip 10 is used as an alternative for a floppy disk or a hard disk.

(1) Since an address to be accessed is set in the internal address counter 113 of the semiconductor memory chip 10 by an external command, the number of pins for receiving an address signal need not be increased even when the memory capacity is increased. For this reason, when the capacity of the semiconductor memory is increased to 8, 16, or 64 Mbits in future as an alternative for a floppy disk or a hard disk, since the number of address dedicated input terminals will not be increased, the package size of the semiconductor memory need not be increased and the mounting space of the printed circuit board, which mounts the semiconductor memory chip will not be increased, either.

(2) Since the semiconductor memory chip 10 itself can automatically identify an access to its own chip according to a memory address value by assigning a chip address using a chip select signal (CS0-7), when a plurality of semiconductor memory chips 10 are mounted on a circuit board to constitute a file device, an external circuit need not be arranged in consideration of the memory capacity and the number of mounted chips.

(3) Since an operation mode can be set by a command on the basis of the I/O access method, no memory address space of the CPU is required.

(4) The switch 503 for generating a write protection signal is provided to the memory board, and a write enable/disable state can be set by this switch without using any external control circuit.

(5) When the semiconductor memory chips 10 are connected in parallel with each other, an arbitrary data width (e.g., 8 bits (byte), 16 bits (word), and the like) can be easily realized.

The present invention is not limited to the above embodiments. For example, FIGS. 11 and 12 show the embodiment of a semiconductor memory board using the semiconductor memory of the present invention. However, it is easy for those who are skilled in the art to realize a semiconductor memory card.

In the embodiment shown in FIGS. 1 and 2, a plurality of chip select input terminals are arranged under an assumption that a plurality of chips are used in a memory cell array. However, if the degree of integration is remarkably increased in future along with the advance of the semiconductor technique, and a memory cell array can be constituted by one chip, the plurality of chip select input terminals may be omitted.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory comprising:
   a memory cell array;
   a plurality of data input/output terminals for exchanging input/output data to/from said memory cell array with an external circuit;
   an address counter for sequentially incrementing a value of address data set therein, and outputting an incremented value of the address data;
   means for receiving a command supplied from the external circuit via said data input/output terminals, and setting a value of the address data designated by the command in said address counter;
   an access circuit for selectively accessing said memory cell array in accordance with a value of a lower bit portion, corresponding to a memory capacity of said memory cell array, of the address data output from said address counter;
   a plurality of chip select input terminals, which are set with potentials so as to assign a chip address; and
   an access control circuit for comparing a chip address value defined by a potential setting state of said plurality of chip select input terminals and a value of an upper bit portion of the address data output from said address counter, and enabling/disabling an access operation by said access circuit according to a coincidence/non-coincidence between the two values.

2. A memory according to claim 1, wherein said address counter increments a value of the address data every time an access to said memory cell array is executed.

3. A memory according to claim 1, further comprising an input terminal for receiving a write protection signal indicating a data write disable state to said memory cell array from the external circuit.

4. A semiconductor memory board comprising:
   a circuit board; and
   a plurality of semiconductor memory chips, which are arranged on said circuit board, and are each constituted by one chip, each of said semiconductor memory chips comprising:
   a memory cell array;
   a plurality of data input/output terminals for exchanging input/output data to/from said memory cell array with an external circuit;
   an address counter for sequentially incrementing a value of address data set therein, and outputting an incremented value of the address data;
   means for receiving a command supplied from the external circuit via said data input/output terminals, and setting a value of the address data designated by the command in said address counter;
   an access circuit for selectively accessing said memory cell array in accordance with a value of a lower bit portion, corresponding to a memory capacity of said memory cell array, of the address data output from said address counter;
   a plurality of chip select input terminals, which are set with potentials so as to assign a chip address., and
   an access control circuit for comparing a chip address value defined by a potential setting state of said plurality of chip select input terminals and a value of an upper bit portion of the address data output from said address counter, and enabling/disabling an access operation by said access circuit according to a coincidence/non-coincidence between the two values,
   wherein said chip select input terminals of each of said plurality of semiconductor memory chips are set with the potentials when said chip select input terminals are connected to a power supply potential line or ground potential line on said circuit board.

5. A memory board according to claim 4, wherein said chip select input terminals are set with the potentials when said chip select input terminals are connected to the power supply potential line or ground potential line on said circuit board.

6. A memory board according to claim 4, wherein each of said semiconductor memory chips further comprises an input terminal (104) for receiving a write protection signal for disabling a data write access, and
   said circuit board further comprises an operation switch for selectively supplying the write protection signal to each of said plurality of semiconductor memory chips.

7. A memory board according to claim 4, further comprising:
   a data bus for transferring input/output data common to said semiconductor memory chips; and
   a control signal line for supplying a common chip select signal.

8. A semiconductor memory board of claim 7 having an 8-bit data width.

9. A memory board according to claim 4, further comprising:

a data bus for transferring different input/output data for said semiconductor memory chips; and a control signal line for supplying different chip select signals.

10. A semiconductor memory board of claim 9 having a 16-bit data width.

11. A semiconductor memory card comprising:
a circuit board; and
a plurality of semiconductor memory chips, which are arranged on said circuit board, and are each constituted by one chip, each of said semiconductor memory chips comprising:
a memory cell array;
a plurality of data input/output terminals for exchanging input/output data to/from said memory cell array with an external circuit;
an address counter for sequentially incrementing a value of address data set therein, and outputting an incremented value of the address data;
means for receiving a command supplied from the external circuit via said data input/output terminals, and setting a value of the address data designated by the command in said address counter;
an access circuit for selectively accessing said memory cell array in accordance with a value of a lower bit portion, corresponding to a memory capacity of said memory cell array, of the address data output from said address counter;
a plurality of chip select input terminals, which are set with potentials so as to assign a chip address; and
and access control circuit for comparing a chip address value defined by a potential setting state of said plurality of chip select input terminals and a value of an upper bit portion of the address data output from said address counter, and enabling/disabling an access operation by said access circuit according to a coincidence/non-coincidence between the two values,
wherein said chip select input terminals of each of said plurality of semiconductor memory chips are set with the potentials when said chip select input terminals are connected to a power supply potential line or ground potential line on said circuit board.

12. A memory card according to claim 11, wherein said chip select input terminals are set with the potentials when said chip select input terminals are connected to the power supply potential line or ground potential line on said circuit board.

13. A memory card according to claim 11, wherein each of said semiconductor memory chips further comprises an input terminal for receiving a write protection signal for disabling a data write access, and said circuit board further comprises an operation switch for selectively supplying the write protection signal to each of said plurality of semiconductor memory chips.

14. A semiconductor memory comprising:
a memory cell array;
a plurality of data input/output terminals for exchanging input/output data to/from said memory cell array with an external circuit;
an address counter for sequentially incrementing a value of address data set therein, and outputting an incremented value of the address data;
means for receiving a command supplied from the external circuit via said data input/output terminals, and setting a value of the address data designated by the command in said address counter; and
an access circuit for selectively accessing said memory cell array in accordance with a value of a lower bit portion, corresponding to a memory capacity of said memory cell array, of the address data output from said address counter.

15. A memory according to claim 14, further comprising:
a plurality of chip select input terminals, which are set with potentials so as to assign a chip address; and
an access control circuit for comparing a chip address value defined by a potential setting state of said plurality of chip select input terminals and a value of an upper bit portion of the address data output from said address counter, and enabling/disabling an access operation by said access circuit according to a coincidence/non-coincidence between the two values.

16. A semiconductor memory board mounting a plurality of semiconductor memories of claim 14 on a circuit board.

17. A memory board according to claim 16, wherein each of said semiconductor memories further comprises an input terminal for receiving a write protection signal for disabling a data write access, and said circuit board further comprises an operation switch for generating the write protection signal.

18. A semiconductor memory card mounting a plurality of semiconductor memories of claim 14 on a circuit board.

19. A memory card according to claim 17, wherein each of said semiconductor memories further comprises an input terminal for receiving a write protection signal for disabling a data write access, and said circuit board further comprises an operation switch for generating the write protection signal.

* * * * *